(12) United States Patent
He et al.

(10) Patent No.: US 11,167,356 B2
(45) Date of Patent: Nov. 9, 2021

(54) COATED TOOL AND CUTTING TOOL INCLUDING SAME

(71) Applicant: KYOCERA CORPORATION, Kyoto (JP)

(72) Inventors: Dan He, Saitama (JP); Tsuyoshi Yamasaki, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 25 days.

(21) Appl. No.: 16/651,389

(22) PCT Filed: Sep. 26, 2018

(86) PCT No.: PCT/JP2018/035611
§ 371 (c)(1),
(2) Date: Mar. 27, 2020

(87) PCT Pub. No.: WO2019/065706
PCT Pub. Date: Apr. 4, 2019

(65) Prior Publication Data
US 2020/0298315 A1    Sep. 24, 2020

(30) Foreign Application Priority Data
Sep. 27, 2017 (JP) ............................. JP2017-186516

(51) Int. Cl.
*B23B 27/14*    (2006.01)
*B23C 5/16*    (2006.01)
(Continued)

(52) U.S. Cl.
CPC ............ *B23B 27/14* (2013.01); *B23C 5/16* (2013.01); *C23C 14/0635* (2013.01);
(Continued)

(58) Field of Classification Search
CPC .............................. B23B 27/148; C23C 28/42
(Continued)

(56) References Cited

U.S. PATENT DOCUMENTS

| 6,103,357 A | 8/2000 | Selinder et al. |
| 2008/0166583 A1 | 7/2008 | Astrand |

(Continued)

FOREIGN PATENT DOCUMENTS

| CN | 101209611 A | 7/2008 |
| CN | 102917822 A | 2/2013 |

(Continued)

OTHER PUBLICATIONS

Internet Archive of "Fixed Blade Utility Knife" on sale at Home Depot, Mar. 31, 2015 (Year: 2015).

*Primary Examiner* — Archene A Turner
(74) *Attorney, Agent, or Firm* — Viering, Jentschura & Partner mbB

(57) ABSTRACT

A coated tool may include a base member and a coating layer located on the base member. The coating layer may include a plurality of AlTi layers including aluminum and titanium as a main component, and a plurality of AlCr layers including aluminum and chromium as a main component. The AlTi layers and the AlCr layers may be located alternately one upon another. The plurality of AlTi layers may include a first AlTi layer and a second AlTi layer located farther away from the base member than the first AlTi layer. Each of the plurality of AlTi layers may further include chromium, and a content ratio of chromium in the second AlTi layer may be higher than a content ratio of chromium in the first AlTi layer.

7 Claims, 5 Drawing Sheets

(51) Int. Cl.
*C23C 14/06* (2006.01)
*C23C 14/14* (2006.01)
*C23C 14/34* (2006.01)
*C23C 28/02* (2006.01)

(52) U.S. Cl.
CPC ............. *C23C 14/14* (2013.01); *C23C 14/34* (2013.01); *C23C 28/02* (2013.01)

(58) Field of Classification Search
USPC .................................................. 428/697, 699
See application file for complete search history.

(56) References Cited

U.S. PATENT DOCUMENTS

| | | |
|---|---|---|
| 2008/0166588 A1 | 7/2008 | Astrand |
| 2013/0071620 A1 | 3/2013 | Waki et al. |
| 2015/0328690 A1 | 11/2015 | Sakamoto |
| 2017/0009352 A1 | 1/2017 | Kubo et al. |
| 2019/0040519 A1 | 2/2019 | Sato et al. |
| 2019/0247930 A1 | 8/2019 | Tanaka et al. |
| 2020/0189007 A1* | 6/2020 | He ............... C23C 28/40 |
| 2020/0222989 A1* | 7/2020 | He ............... B23B 27/148 |
| 2020/0298318 A1* | 9/2020 | He ............... C23C 28/042 |

FOREIGN PATENT DOCUMENTS

| | | |
|---|---|---|
| CN | 104349855 A | 2/2015 |
| CN | 105792967 A | 7/2016 |
| JP | 2001521447 A | 11/2001 |
| JP | 2008162009 A | 7/2008 |
| JP | 2011011286 A | 1/2011 |
| JP | 2014091169 A | 5/2014 |
| JP | 2017042906 A | 3/2017 |
| KR | 20130098861 A | 9/2013 |
| WO | 2018100849 A1 | 6/2018 |
| WO | 2019044714 A1 | 3/2019 |
| WO | 2019044715 A1 | 3/2019 |

* cited by examiner

COATED TOOL AND CUTTING TOOL INCLUDING SAME

CROSS-REFERENCE TO RELATED APPLICATIONS

This application is a national stage entry according to 35 U.S.C. 371 of PCT Application No. PCT/JP2018/035611 filed on Sep. 26, 2018, which claims priority to Japanese Application No. 2017-186516 filed on Sep. 27, 2017, which are entirely incorporated herein by reference.

TECHNICAL FIELD

The present disclosure relates to a coated tool for use in a cutting process, and a cutting tool including the coated tool.

BACKGROUND

As a coated tool for use in a cutting process, such as a turning process and a milling process, a surface coated cutting tool (coated tool) has been discussed, for example, in Japanese Unexamined Patent Publication No. 2017-042906 (Patent Document 1). The coated tool discussed in Patent Document 1 may include a tool base member and a hard coating layer in which an A layer represented by $(Ti_{1-z}Al_z)N$ and a B layer represented by $(Cr_{1-x-y}Al_xM_y)N$ are laminated alternately one upon another on a surface of the tool base member.

SUMMARY

A coated tool according to a non-limiting aspect of the present disclosure may include a base member and a coating layer located on the base member. The coating layer may include a plurality of AlTi layers including aluminum and titanium as a main component, and a plurality of AlCr layers including aluminum and chromium as a main component, the AlTi layers and the AlCr layers may be located alternately one upon another. The plurality of AlTi layers may include a first AlTi layer and a second AlTi layer located farther away from the base member than the first AlTi layer. Each of the plurality of AlTi layers may further include chromium, and a content ratio of chromium in the second AlTi layer may be higher than a content ratio of chromium in the first AlTi layer.

A cutting tool according to a non-limiting aspect of the present disclosure may include a holder including a pocket located at a side of a front end of the holder, and in another non-limiting aspect of the present disclosure, the above coated tool may be located in the pocket.

DETAILED DESCRIPTION

<Coated Tool>

Figure 1:
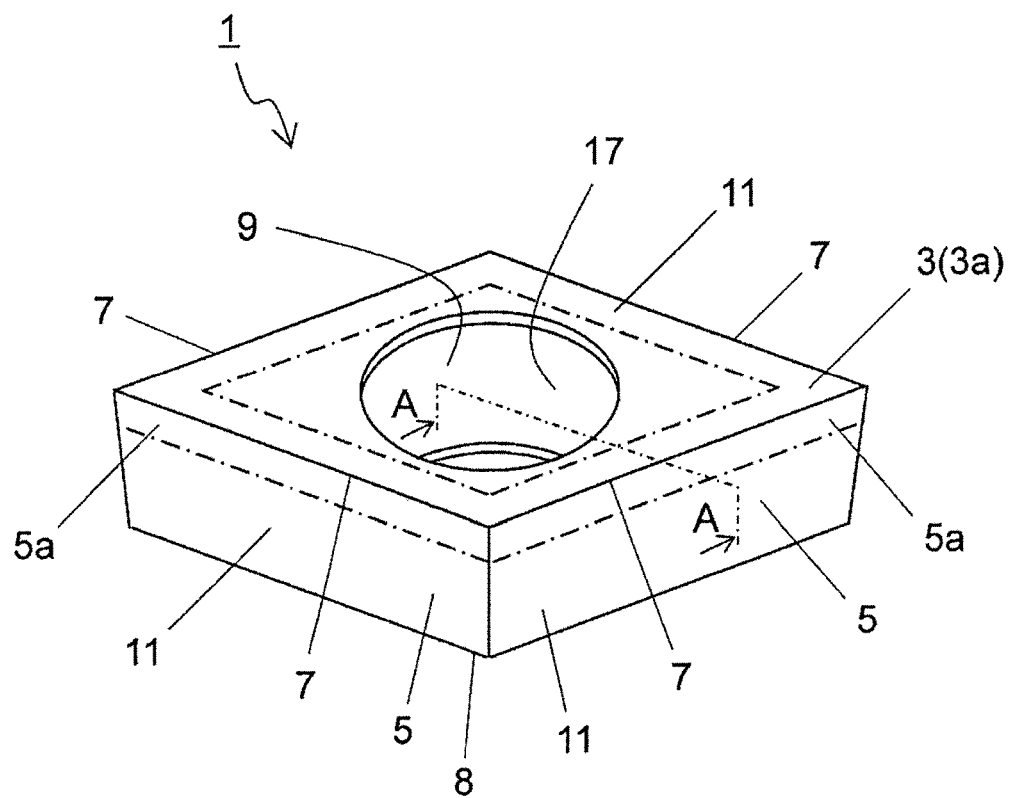
FIG. 1 is a perspective view illustrating a coated tool in a non-limiting embodiment of the present disclosure.

Coated tools in various non-limiting embodiments of the present disclosure are described in detail below with reference to the drawings. For the sake of description, the drawings referred to in the following illustrate, in a simplified form, only main members necessary for describing the various non-limiting embodiments. The coated tools are therefore capable of including any arbitrary structural member not illustrated in the drawings referred to. Sizes of the members in each of the drawings faithfully represent neither sizes of actual structural members nor size ratios of these members. These are also true for a cutting tool described later.

A coated tool 1 in a non-limiting embodiment has a quadrangular plate shape and includes a first surface 3 (upper surface in FIG. 1) having a quadrangular shape, a second surface 5 (side surface in FIG. 1), and a cutting edge 7 located on at least a part of a ridge line where the first surface 3 intersects with the second surface 5. The coated tool 1 in a non-limiting embodiment further includes a third surface 8 (lower surface in FIG. 1) having a quadrangular shape.

The entirety of an outer periphery of the first surface 3 may serve as the cutting edge 7 in the coated tool 1 of a non-limiting embodiment. The coated tool 1 is not limited to the above configuration. For example, the cutting edge 7 may be located on only one side or a part of the first surface 3 having the quadrangular shape.

The first surface 3 may at least partially include a rake surface region 3a. A region in the first surface 3 which is located along the cutting edge 7 serves as the rake surface region 3a in a non-limiting embodiment. The second surface 5 may include at least partially a flank surface region 5a. A region in the second surface 5 which is located along the cutting edge 7 serves as the flank surface region 5a in a non-limiting embodiment. In other words, the cutting edge 7 is located on an intersecting part of the rake surface region 3a and the flank surface region 5a.

In FIG. 1, a boundary between the rake surface region 3a and other region on the first surface 3 is indicated by a chain line. A boundary between the flank surface region 5a and other region on the second surface 5 is indicated by a chain line. Because FIG. 1 illustrates a non-limiting embodiment in which all the ridge line where the first surface 3 intersects with the second surface 5 serves as the cutting edge 7, the chain line indicating the boundary on the first surface 3 is ring-shaped.

A size of the coated tool 1 is not particularly limited. For example, a length of one side of the first surface 3 is settable to approximately 3-20 mm in a non-limiting embodiment. A height from the first surface 3 to the third surface 8 located on an opposite side of the first surface 3 is settable to approximately 5-20 mm.

Figure 2:
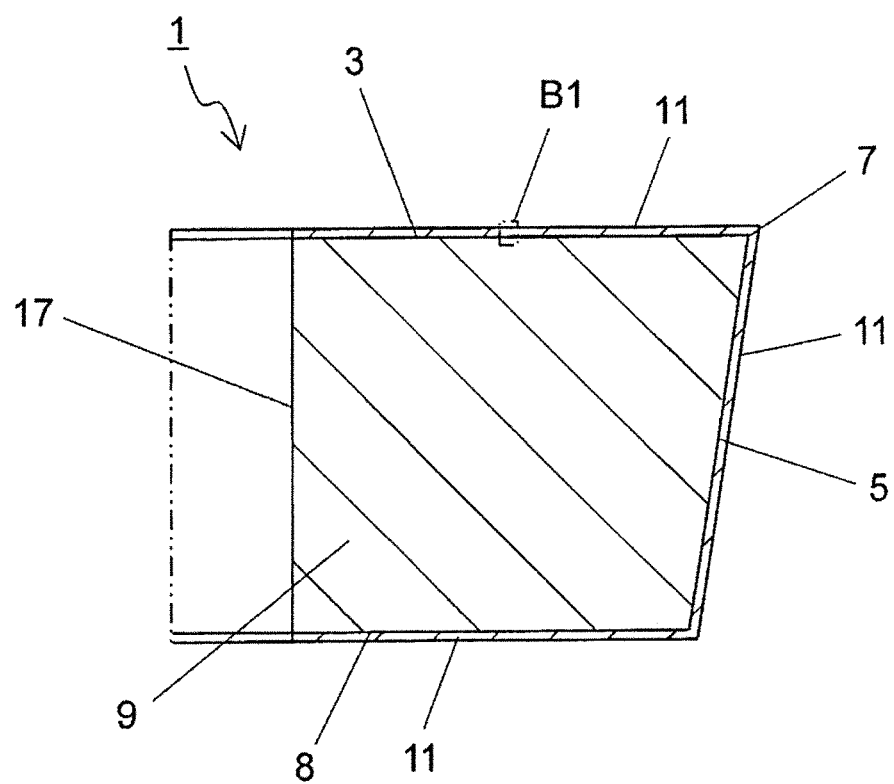
FIG. 2 is a sectional view taken along line A-A in the coated tool illustrated in FIG. 1.

As illustrated in FIGS. 1 and 2, the coated tool 1 includes a base member 9 having a quadrangular plate shape, and a coating layer 11 that coats a surface of the base member 9 in a non-limiting embodiment. The coating layer 11 may cover the whole or only a part of the surface of the base member 9. If the coating layer 11 covers only the part of the base member 9, it can be said that the coating layer 11 is located on at least the part of the base member 9.

A thickness of the coating layer 11 is settable to, for example, approximately 0.1-10 µm. The thickness of the coating layer 11 may be constant or may be changed depending on location.

Figure 3:
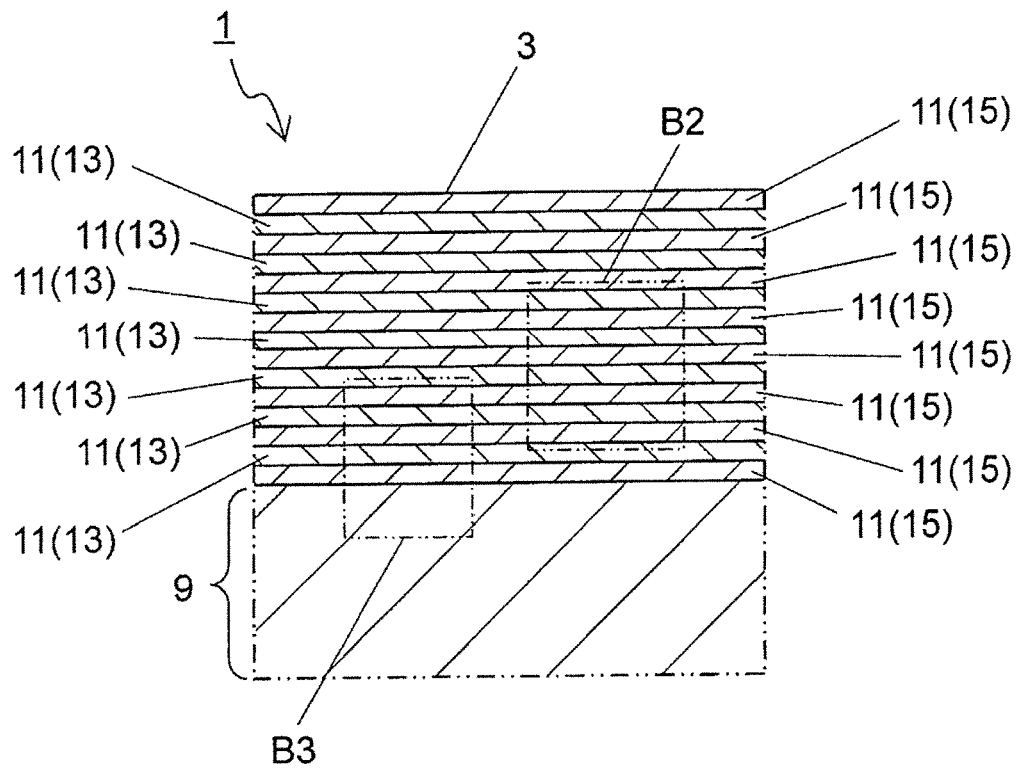
FIG. 3 is an enlarged view of a region B1 illustrated in FIG. 2.
Figure 4:
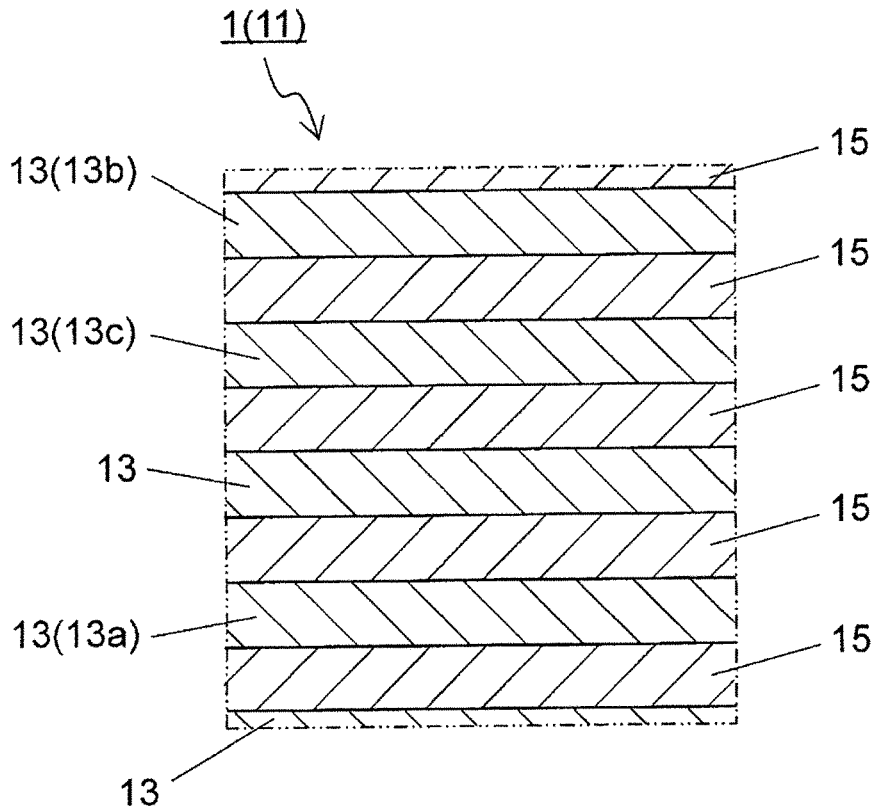
FIG. 4 is an enlarged view of a region B2 illustrated in FIG. 3.

As illustrated in FIGS. 3 and 4, the coating layer 11 includes a plurality of AlTi layers 13 including aluminum (Al) and titanium (Ti) as a main component, and a plurality of AlCr layers 15 including aluminum and chromium (Cr) as a main component. The coating layer 11 has a configuration in which the plurality of AlTi layers 13 and the plurality of AlCr layers 15 are located alternately one upon another. In other words, the coating layer 11 has a configuration in which the plurality of AlTi layers 13 and the plurality of AlCr layers 15 are laminated alternately one upon another. A laminate structure of the coating layer 11 is evaluable by cross section measurement using a scanning electron microscopy (SEM) or transmission electron microscopy (TEM).

The AlTi layer 13 further includes chromium in addition to aluminum and titanium. The AlTi layer 13 may include a metal component, such as Si, Nb, Hf, V, Ta, Mo, Zr, and W. A sum of content ratios of aluminum and titanium is higher than that of chromium and the metal component in the AlTi layer 13. A content ratio of aluminum is settable to, for example, 40-70%. A content ratio of titanium is settable to, for example, 25-55%. The term "content ratio" indicates a content ratio in terms of atomic ratio.

The content ratio of aluminum may be higher than the content ratio of titanium in each of the AlTi layers 13. Alternatively, the content ratio of titanium may be higher than the content ratio of aluminum in each of the AlTi layers 13. Each of the plurality of AlTi layers 13 includes chromium at a ratio smaller than the sum of content ratios of aluminum and titanium. The content ratio of chromium is settable to, for example, 0.1-20%.

The AlTi layer 13 may be composed only of a metal component including aluminum, titanium, and chromium. Alternatively, aluminum, titanium, and chromium may be a nitride, carbide, or carbonitride including one or a plurality of them.

The AlCr layer 15 may be composed only of aluminum and chromium, or alternatively, may include a metal component, such as Si, Nb, Hf, V, Ta, Mo, Zr, Ti, and W, in addition to aluminum and chromium. The sum of content ratios of aluminum and chromium is higher than that of the metal component in the AlCr layer 15. The content ratio of aluminum is settable to, for example, 20-60%. The content ratio of chromium is settable to, for example, 40-80%.

The content ratio of aluminum may be higher than the content ratio of chromium in each of the AlCr layers 15. The content ratio of chromium may be higher than the content ratio of aluminum in each of the AlCr layers 15.

The AlCr layers 15 may be composed only of a metal component including aluminum and chromium. Alternatively, aluminum and chromium may be a nitride, carbide, or carbonitride including one or all of them.

Compositions of the AlTi layers 13 and the AlCr layers 15 are measurable using, for example, energy dispersive X-ray spectroscopy (EDS) or X-ray photoelectron spectroscopy (XPS).

The number of the AlTi layer 13 and the number of the AlCr layer 15 are not limited to a specific value. The number of the AlTi layer 13 and the number of the AlCr layer 15 may be individually two or more, and are settable to, for example, 2 to 500.

Since the coating layer 11 includes the AlTi layer 13, it has high fracture resistance. Since the coating layer 11 includes the AlCr layer 15, it has high wear resistance. Strength of the coating layer 11 is high as a whole since the coating layer 11 has a configuration in which the AlTi layers 13 and the AlCr layers 15 are located alternately one upon another.

Strength of the coating layer 11 is high as a whole in the case where the thickness of each of the plurality of AlTi layers 13 and the plurality of AlCr layers 15 is small and the number of the plurality of AlTi layers 13 and the plurality of AlCr layers 15 is large, as compared with the case where the thickness of each of the plurality of AlTi layers 13 and the plurality of AlCr layers 15 is large and the number of the plurality of AlTi layers 13 and the plurality of AlCr layers 15 is small.

The thicknesses of the AlTi layer 13 and the AlCr layer 15 are not limited to a specific value, but are settable to 5-100 nm each. The thicknesses of the plurality of AlTi layers 13 and the plurality of AlCr layers 15 may be constant or may be different from each other.

The plurality of AlTi layers 13 in a non-limiting embodiment include a first AlTi layer 13a and a second AlTi layer 13b as illustrated in FIG. 4. The second AlTi layer 13b is located farther away from the base member 9 than the first AlTi layer 13a. The coated tool 1 has a configuration in which a content ratio of chromium in the second AlTi layer 13b is higher than a content ratio of chromium in the first AlTi layer 13a. The coated tool 1 satisfying these configurations is excellent in durability.

When layers including different compositions such as AlTi layers and AlCr layers are located alternately one upon another, separation may occur at an interface between adjacent layers. In particular, since the outer surface of the coated tool is susceptible to load during a cutting process, the above-described separation is likely to occur at a part of the above-described interface close to the outer surface of the coated tool.

In a non-limiting embodiment, as described above, the AlTi layer 13 includes aluminum and titanium as a main component, and includes chromium at a ratio smaller than the sum of content ratios of aluminum and titanium. The AlTi layer 13 satisfying such a configuration is high in affinity with the AlCr layer 15 since the AlTi layer 13 includes chromium similarly to the AlCr layer 15 while relatively maintaining the characteristics of the AlTi layer 13. Therefore, the AlTi layer 13 has a high joinability (adhesion) with the adjacent AlCr layer 15.

The second AlTi layer 13b, which is located farther away from the base member 9 than the first AlTi layer 13a, is more susceptible to a large cutting load than the first AlTi layer 13a during a cutting process. The coating layer 11 in a non-limiting embodiment includes the content ratio of chromium in the second AlTi layer 13b higher than the content ratio of chromium in the first AlTi layer 13a, and hence the joinability with the adjacent AlCr layer 15 is high, allowing the coating layer 11 to withstand a large cutting load.

The content ratio of chromium in the first AlTi layer 13a is lower than the content ratio of chromium in the second AlTi layer 13b. This causes separation to be less likely to occur at a part of the coating layer 11 close to the base member 9 and can reduce the influence of the coating layer 11 as a whole on the fracture resistance in the AlTi layer 13.

For this reason, the coated tool 1 in a non-limiting embodiment is less likely to cause interlayer separation and is excellent in durability. The coated tool 1 in the non-limiting embodiment is therefore capable of carrying out a cutting process that is stable over a long term.

The plurality of AlTi layers 13 may further include a third AlTi layer 13c located between the first AlTi layer 13a and the second AlTi layer 13b. The coated tool 1 may have a configuration in which the content ratio of chromium in the third AlTi layer 13c is higher than the content ratio of chromium in the first AlTi layer 13a and lower than the content ratio of chromium in the second AlTi layer 13b. The coated tool 1 satisfying such a configuration is excellent in durability.

This is because the content ratios of chromium in the plurality of AlTi layers 13 including the first AlTi layer 13a, the second AlTi layer 13b, and the third AlTi layer 13c are gently changed stepwise to avoid a rapid change. It is therefore possible to avoid rapid changes of toughness and hardness in the plurality of AlTi layers 13. This makes it easier to avoid occurrence of cracks due to stress concentration in the coating layer 11.

The coating layer 11 includes five or more AlTi layers 13, and the AlCr layers 15 are located between the first AlTi layer 13a and the third AlTi layer 13c, and between the third AlTi layer 13c and the second AlTi layer 13b in FIG. 4.

The plurality of AlTi layers 13 may include a higher content ratio of chromium as going farther away from the base member 9. In other words, in cases where the coating layer 11 includes four or more AlTi layers 13, the AlTi layer 13 located farther away from the base member 9 may include a higher content ratio of chromium. The durability of the coated tool 1 can be still further enhanced if such a configuration is satisfied. This is because it becomes easy to ensure that the content ratio of chromium in one of the plurality of AlTi layers 13 which is located farthest away from the base member 9 is extremely high, while avoiding the rapid change of the toughness and hardness in the plurality of AlTi layers 13.

The content ratio of aluminum in the second AlTi layer 13b may be lower than the content ratio of aluminum in the first AlTi layer 13a. The toughness of the first AlTi layer 13a is higher than that of the second AlTi layer 13b when such a configuration is satisfied. Therefore, the coating layer 11 is excellent in adhesion.

Figure 5:
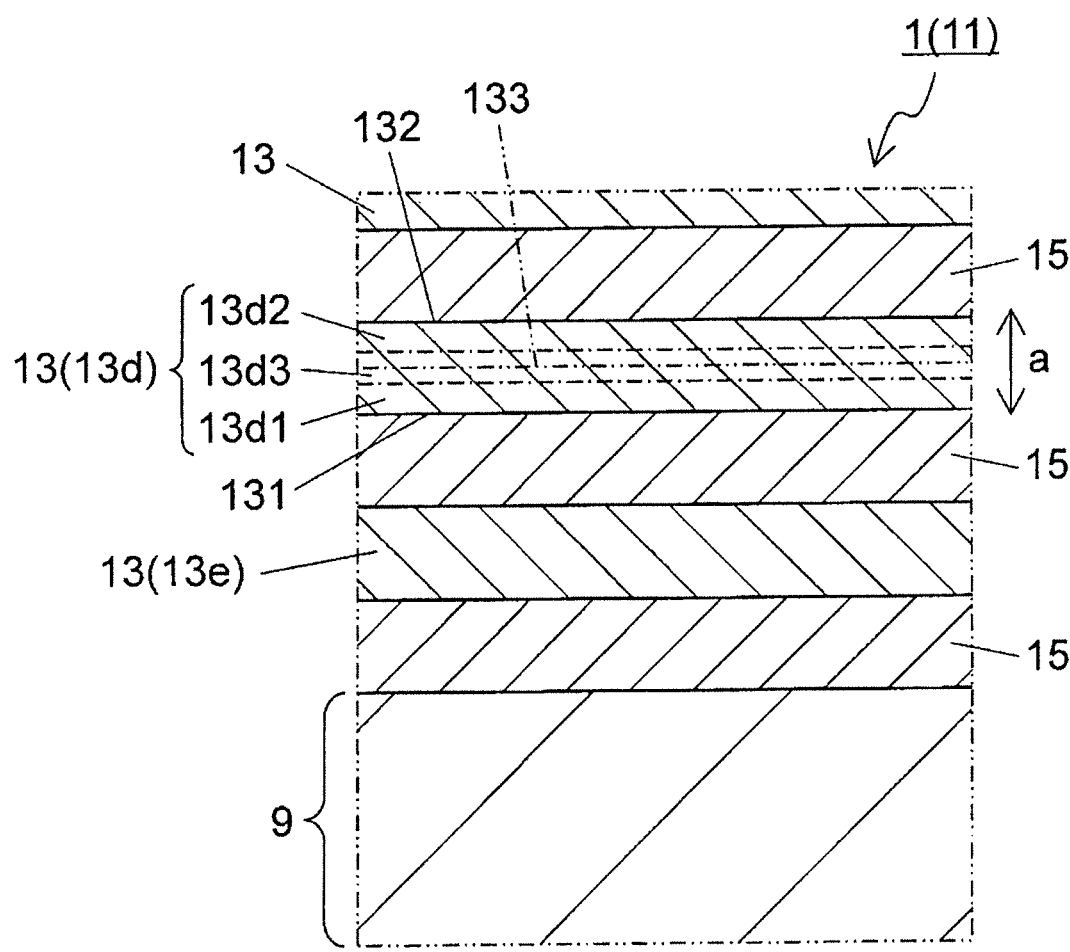
FIG. 5 is an enlarged view of a region B3 illustrated in FIG. 3.

As illustrated in FIG. 5, an AlTi layer 13d of the plurality of AlTi layers 13 which is held between the AlCr layers 15 may include a first region 13d1 including an inner side surface 131 located on the side of the base member 9, a second region 13d2 including an outer side surface 132 located on the opposite side to the inner side surface 131, and a third region 13d3 including a center 133 in a thickness direction a located between the first region 13d1 and the second region 13d2.

At this time, the content ratio of chromium in the first region 13d1 and the second region 13d2 may be higher than the content ratio of chromium in the third region 13d3. When these configurations are satisfied, the content ratio of chromium in the first region 13d1 and the second region 13d2 facing the AlCr layer 15 is relatively high, and thus the joinability between the AlTi layer 13 and the AlCr layer 15 is further enhanced.

The base member 9 may include tungsten carbide (WC) and cobalt (Co) as described later. At this time, at least an AlTi layer 13e of the plurality of AlTi layers 13 which is located closest to the base member 9 may include cobalt, and the content ratio of cobalt may be higher than the content ratio of chromium. When the AlTi layer 13e located closest to the base member 9 includes cobalt, the joinability of the coating layer 11 to the base member 9 is high.

Furthermore, when the content ratio of cobalt is higher than the content ratio of chromium, the joinability of the coating layer 11 to the base member 9 is high due to the relatively high content ratio of cobalt, and the toughness of the AlTi layer 13e is high due to suppressed content ratio of chromium.

Although the coated tool 1 has the quadrangular plate shape as illustrated in FIG. 1 in a non-limiting embodiment, the shape of the coated tool 1 is not limited thereto. There is no problem even if the first surface 3 and the third surface 8 may have, for example, a triangular shape, a hexagonal shape or a circular shape instead of the quadrangular shape.

The coated tool 1 includes a through hole 17 as illustrated in FIG. 1 in a non-limiting embodiment. The through hole 17 is extended from the first surface 3 to the third surface 8 located on the opposite side of the first surface 3 in a non-limiting embodiment, and the through hole 17 opens into these surfaces. The through hole 17 is usable for attaching a screw or clamping member when the coated tool 1 is held onto a holder. There is no problem even if the through hole 17 opens into regions located on opposite sides in the second surface 5.

Examples of material of the base member 9 include inorganic materials, such as cemented carbide, cermet and ceramics. Examples of composition of cemented carbide include WC(tungsten carbide)-Co, WC—TiC(titanium carbide)-Co and WC—TiC—TaC(tantalum carbide)-Co. Specifically, WC, TiC and TaC are hard particles, and Co is a binding phase. The cermet is a sintered composite material obtainable by compositing metal into a ceramic component. Specific examples of the cermet include compounds composed mainly of TiC or TiN (titanium nitride). The material of the base member 9 is not limited to these materials.

The coating layer 11 can be located on the base member 9 by using, for example, physical vapor deposition (PVD) method. In cases where the coating layer 11 is deposited with the base member 9 held on an inner peripheral surface of the through hole 17 by using the above vapor deposition method, the coating layer 11 can be located so as to cover the entirety of the surface of the base member 9 except for the inner peripheral surface of the through hole 17.

Examples of the physical vapor deposition method include ion plating method and sputtering method. As one example of the deposition with the ion plating method, the coating layer 11 can be deposited with the following method.

In a first procedure, a metal target independently including aluminum, titanium, and chromium, a composite alloy target or a sintered body target is prepared. The above target serving as a metal source is vaporized and ionized by an arc discharge and a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The AlTi layer 13 is formable through the above procedure.

In a second procedure, a metal target independently including aluminum and chromium, a composite alloy target or a sintered body target is prepared. The above target serving as a metal source is vaporized and ionized by an arc discharge and a glow discharge. The ionized target is reacted with nitrogen ($N_2$) gas as a nitrogen source, and methane ($CH_4$) gas or acetylene ($C_2H_2$) gas as a carbon source, and is deposited on the surface of the base member 9. The AlCr layer 15 is formable through the above procedure.

The coating layer 11 configured such that the plurality of AlTi layers 13 and the plurality of AlCr layers 15 are laminated alternately one upon another is formable by alternately repeating the first procedure and the second procedure. There is no problem even if the first procedure is carried out after the second procedure.

Here, when the first procedure is repeated, the plurality of AlTi layers 13 including the first AlTi layer 13a and the second AlTi layer 13b can be manufactured by changing the ratio of chromium so that the ratio of chromium increases in the middle.

It is possible to ensure that the AlTi layer 13 located farther away from the base member 9 includes a higher content ratio of chromium by, for example, gradually changing the ratio of chromium as the ratio of chromium gradually increases from the first execution of the first procedure to the final execution of the first procedure when the first procedure is repeated.

<Cutting Tool>

Cutting tools in various non-limiting embodiments of the present disclosure are described below with reference to the drawings.

Figure 6:
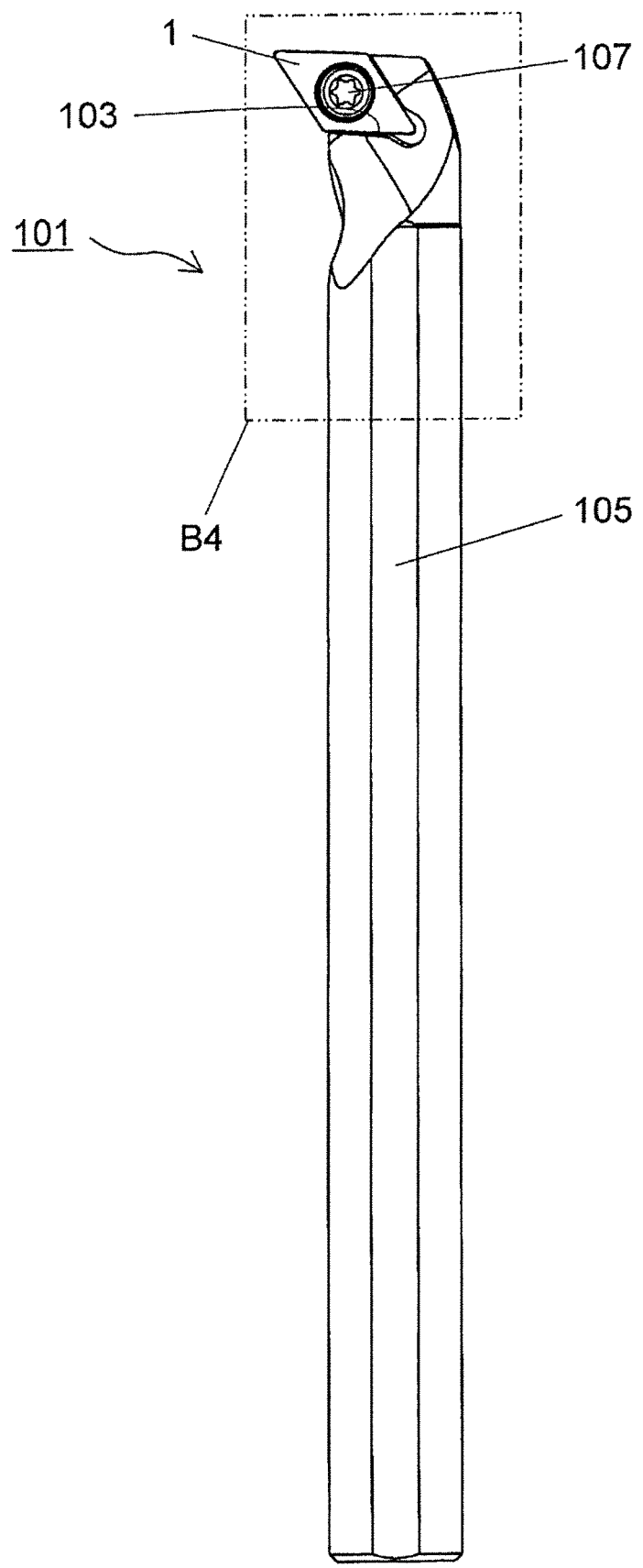
FIG. 6 is a plan view illustrating a cutting tool in a non-limiting embodiment of the present disclosure.
Figure 7:
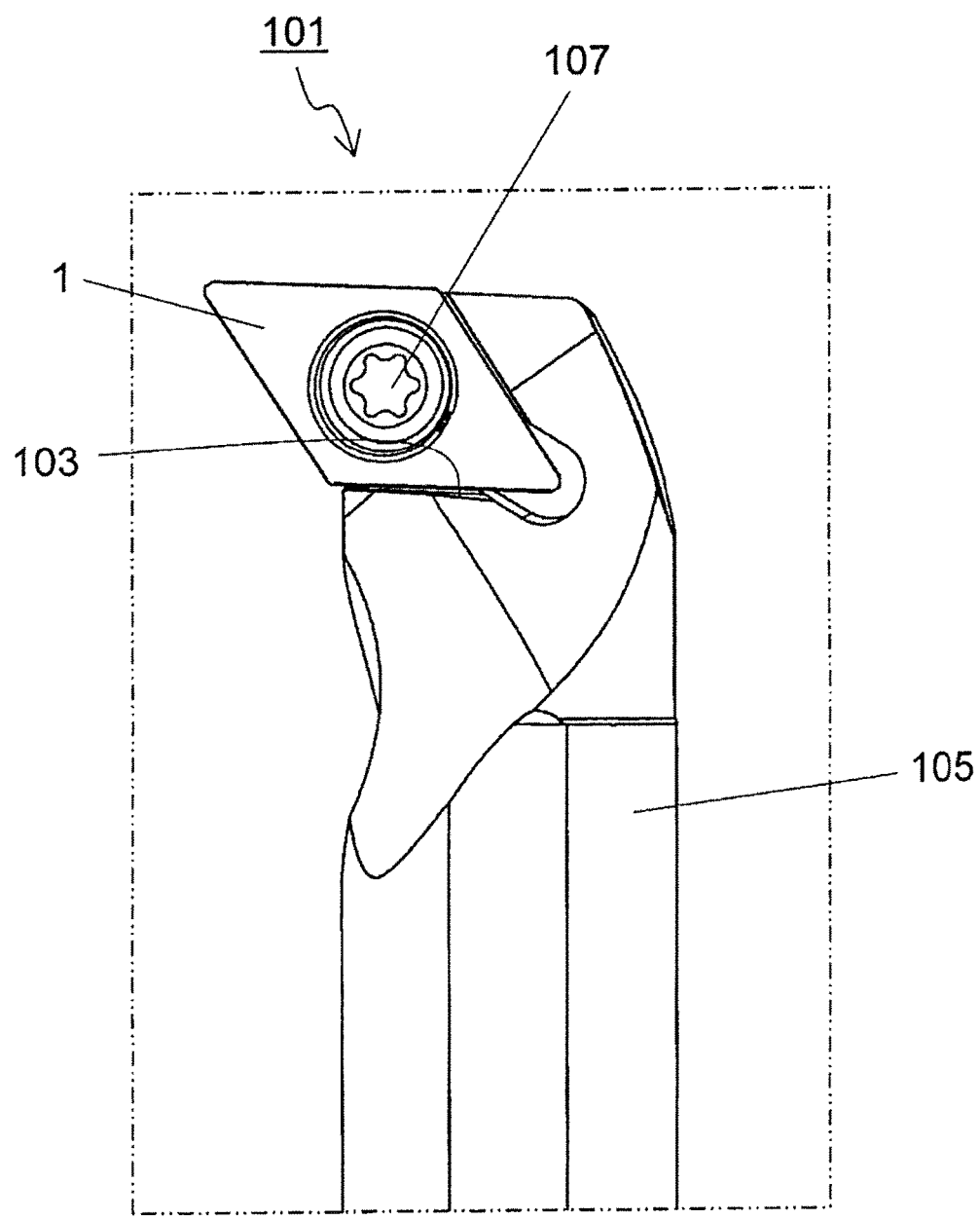
FIG. 7 is an enlarged view of a region B4 illustrated in FIG. 6.

As illustrated in FIG. 6, a cutting tool 101 in a non-limiting embodiment is a bar-shaped body extended from a first end (an upper end in FIG. 6) to a second end (a lower end in FIG. 6). As illustrated in FIG. 7, the cutting tool 101 includes a holder 105 with a pocket 103 located at a side of the first end (front end), and the coated tool 1 located in the pocket 103. The cutting tool 101 including the coated tool 1 is capable of carrying out a cutting process that is stable over a long term.

The pocket 103 is a part that permits attachment of the coated tool 1. The pocket 103 includes a seating surface parallel to a lower surface of the holder 105, and a constraining side surface inclined relative to the seating surface. The pocket 103 opens into a side of the first end of the holder 105.

The coated tool 1 is located in the pocket 103. A lower surface of the coated tool 1 may be in a direct contact with the pocket 103. Alternatively, a sheet (not illustrated) may be held between the coated tool 1 and the pocket 103.

The coated tool 1 is attached such that at least a part of a ridge line where the first surface 3 intersects with the second surface 5, which is usable as the cutting edge 7, is protruded outward from the holder 105. The coated tool 1 is attached to the holder 105 by a fixing screw 107 in a non-limiting embodiment. Specifically, the coated tool 1 is attachable to the holder 105 in such a manner that screw parts are engaged with each other by inserting the fixing screw 107 into the through hole 17 of the coated tool 1, and by inserting a front end of the fixing screw 107 into a screw hole (not illustrated) formed in the pocket 103.

For example, steel and cast iron are usable as a material of the holder 105. Of these materials, as an example, high toughness steel may be used.

The various non-limiting embodiments have illustrated and described the cutting tools for use in the so-called turning process. Examples of the turning process include inner diameter processing, outer diameter processing and grooving process. The cutting tools are not limited to ones which are used for the turning process. For example, the coated tools 1 of the above non-limiting embodiments are applicable to the cutting tools for use in the milling process.

Singular forms "a", "an" and "the" in the entirety of the present disclosure include plural forms thereof unless clearly indicated not being so from the context.

DESCRIPTION OF THE REFERENCE NUMERALS

1: Coated tool
3: First surface
3a: Rake surface region
5: Second surface
5a: Flank surface region
7: Cutting edge
8: Third surface
9: Base member
11: Coating layer
13: AlTi layer
13a: First AlTi layer
13b: Second AlTi layer
13c: Third AlTi layer
13d: AlTi layer
13d1: First region
131: Inner side surface
13d2: Second region
132: Outer side surface
13d3: Third region
133: Center
13e: AlTi layer
15: AlCr layer
17: Through hole
101: Cutting tool
103: Pocket
105: Holder
107: Fixing screw

The invention claimed is:

1. A coated tool, comprising:
a base member; and
a coating layer located on the base member, wherein the coating layer comprises:
   a plurality of AlTi layers comprising aluminum and titanium as a main component, and a plurality of AlCr layers comprising aluminum and chromium as a main component;
   respective AlTi layers of the plurality of AlTi layers and respective AlCr layers of the plurality of AlCr layers being located alternately one upon another;
   the plurality of AlTi layers comprise a first AlTi layer and a second AlTi layer located farther away from the base member than the first AlTi layer;
   each of the plurality of AlTi layers further comprises chromium, and
   a content ratio of chromium in the second AlTi layer is higher than a content ratio of chromium in the first AlTi layer.

2. The coated tool according to claim 1, wherein
the plurality of AlTi layers further comprise a third AlTi layer located between the first AlTi layer and the second AlTi layer; and
a content ratio of chromium in the third AlTi layer is higher than the content ratio of chromium in the first AlTi layer, and is lower than the content ratio of chromium in the second AlTi layer.

3. The coated tool according to claim 2, wherein
the plurality of AlTi layers comprise a higher content ratio of chromium as going farther away from the base member.

4. The coated tool according to claim 1,
wherein
a content ratio of aluminum in the second AlTi layer is lower than a content ratio of aluminum in the first AlTi layer.

5. The coated tool according to claim 1,
wherein
an AlTi layer of the plurality of AlTi layers that is between the AlCr layers comprises:
   a first region comprising an inner side surface located on a side nearest to the base member, a second region comprising an outer side surface located on an opposite side to the inner side surface, and
  a third region comprising a center in a thickness direction located between the first region and the second region; and
a content ratio of chromium in the first region and the second region is higher than a content ratio of chromium in the third region.

6. The coated tool according to claim 1, wherein
the base member comprises tungsten carbide and cobalt; and
at least an AlTi layer of the plurality of AlTi layers which is located closest to the base member further comprises cobalt, and a content ratio of cobalt is higher than a content ratio of chromium_therein.

7. A cutting tool, comprising:
a holder comprising a pocket located at a side of a front end of the holder; and
the coated tool according to claim 1, which is located in the pocket.

* * * * *